(12) United States Patent
Ohmi et al.

(10) Patent No.: US 6,818,852 B2
(45) Date of Patent: Nov. 16, 2004

(54) MICROWAVE PLASMA PROCESSING DEVICE, PLASMA PROCESSING METHOD, AND MICROWAVE RADIATING MEMBER

(75) Inventors: Tadahiro Ohmi, 1-17-301, Komegafukuro 2-chome Aoba-ku, Sendai-shi, Miyagi (JP), 980-0813; Masaki Hirayama, Sendai (JP); Tetsuya Goto, Sendai (JP)

(73) Assignees: Tadahiro Ohmi, Sendai (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/344,761

(22) PCT Filed: Jun. 19, 2002

(86) PCT No.: PCT/JP02/06110
§ 371 (c)(1),
(2), (4) Date: Feb. 14, 2003

(87) PCT Pub. No.: WO03/001578
PCT Pub. Date: Jan. 3, 2003

(65) Prior Publication Data
US 2003/0168436 A1 Sep. 11, 2003

(30) Foreign Application Priority Data
Jun. 20, 2001 (JP) .................................... 2001-186915

(51) Int. Cl.[7] .............................................. B23K 9/00
(52) U.S. Cl. .......................... 219/121.43; 219/121.5; 219/121.55; 118/723 MW; 118/723 MP; 156/345; 204/298.38

(58) Field of Search ............................ 219/121.43, 390, 219/121.5, 121.55; 118/723 MW, 723 MP, 723 MR, 723 MA, 723 AN; 156/345; 204/298.38

(56) References Cited

U.S. PATENT DOCUMENTS 5,024,716 A  6/1991  Sato
5,698,036 A  12/1997 Ishii et al.
6,358,324 B1 * 3/2002 Hongoh et al. ............. 118/728

FOREIGN PATENT DOCUMENTS

| JP | 03262119 | 11/1991 |
| JP | 3-262119 | 11/1991 |
| JP | 8-111297 | 4/1996 |
| JP | 2722070 | 11/1997 |
| JP | 2928577 | 5/1999 |

* cited by examiner

Primary Examiner—Shawntina Fuqua
(74) Attorney, Agent, or Firm—Crowell & Moring LLP

(57) ABSTRACT

A placement stage (24) on which a semiconductor wafer (W) is place is provided within a processing container (22). A microwave is generated by a microwave generator (76), and the microwave is introduced into a process container (22) through a flat antenna member (66). The flat antenna member (66) has a plurality of slots (84) arranged along a plurality of circumferences, and the plurality of circumferences are non-concentric to each other. A distribution of plasma density in the flat antenna member (66) in a radial direction is uniform.

20 Claims, 8 Drawing Sheets (a)

(b) ELECTRON DENSITY ne

POSITION IN RADIAL DIRECTION OF FLAT ANTENNA

MICROWAVE PLASMA PROCESSING DEVICE, PLASMA PROCESSING METHOD, AND MICROWAVE RADIATING MEMBER

TECHNICAL FIELD

The present invention relates to plasma processing apparatuses and, more particularly, to a microwave plasma processing apparatus and a plasma processing method for acting plasma generated by a microwave onto an object to be processed such as a wafer, etc.

BACKGROUND ART

In recent years, with densification and miniaturization of semiconductor products, plasma processing apparatuses have been used for a process such as film deposition, etching, ashing, etc. in a manufacturing process of a semiconductor product. Especially, a microwave plasma processing apparatus that generates plasma using a microwave is capable of stably generating plasma even in a high-vacuum state of a relatively low pressure such as 0.1–10 mToor. For this reason, a microwave plasma processing apparatus using 2.45 GHz microwave, for example, has attracted attention.

Generally, in a microwave plasma processing apparatus, a dielectric plate that can transmit a microwave is provided to a ceiling part of a process container which is made to be evacuatable, and a disc-like, flat antenna member (microwave radiation member) is attached to the dielectric plate. Many through holes (slots) are formed in the antenna member so as to introduce a microwave, which is supplied at the center thereof and propagates in radial directions, into the process container through the slots. Plasma of a process gas is generated by the microwave introduced into the process container, and plasma processing is applied to the semiconductor wafer placed in the process container.

Japanese Patent Publications No. 2722070 and No. 2928577 disclose a microwave plasma processing apparatus having an antenna member for introducing a microwave into a process container. The antenna member disclosed in these patent publications has a circular shape, and many slots or slot pairs are formed along a plurality of concentric circles. Also disclosed is an antenna member having many slots or slot pairs arranged spirally.

A microwave supplied to the central part of the circular antenna member propagates in a radial direction, and the direction is changed by the slots and is introduced into the process container after passing through the dielectric plate. Under such a condition, a surface wave propagating in radial directions (through the dielectric plate) between the antenna member and the plasma is reflected by an outer peripheral surface of the dielectric plate and returns to the central part. Here, in a case where the slots of the antenna member are arranged along a plurality of concentric circles, the surface wave reflected by the entire peripheral surface of the dielectric plate is concentrated into the central part of the antenna member. Therefore, the electric field of the surface wave is large at the central part of the antenna, and decreases toward the peripheral parts.

FIG. 1 is an illustration showing propagation of the surface wave in the antenna member having concentrically arranged slots and a distribution of an electron density in a plasma space. FIG. 1(a) shows surface wave propagation of the dielectric plate in correspondence to the antenna member, and FIG. 1(b) is a graph showing a distribution of electron density of a plasma density in a radial direction of the antenna member. As shown in FIG. 1(b), the electron density ne of the plasma space is maximum at the central part of the antenna member, and the electron density ne decreases toward the periphery of the antenna member. Therefore, in the antenna member having concentrically arranged slots, there is a problem in that the plasma density is uneven since the plasma density corresponding to the central part of the antenna member is higher than the plasma density in the periphery.

DISCLOSURE OF INVENTION

It is a general object of the present invention to provide an improved and useful microwave plasma processing apparatus and a plasma processing method in which the above-mentioned problems are eliminated.

A more specific object of the present invention is to provide a microwave plasma processing apparatus, a plasma processing method and an antenna member which can make a plasma density uniform in a radial direction of an antenna member.

In order to achieve the above-mentioned objects, there is provided according to one aspect of the present invention a microwave plasma processing apparatus which applies plasma processing to a substrate to be processed comprising: a process container provided therein with a placement stage on which the substrate to be processed is placed; a microwave generator which generates a microwave and supplies the microwave to the process container; and a microwave radiation member provided between the microwave generator and the process container so as to radiate the microwave to a space of the process container, wherein the microwave radiation member has a plurality of slots arranged along a plurality of circumferences, and the plurality of circumferences are non-concentric to each other.

In the above-mentioned invention, the centers of the plurality of circumferences may be eccentric in different directions to each other with respect to the center of the microwave radiation member. Additionally, the centers of the plurality of circumferences may be eccentric in the same direction to each other with respect to the center of the microwave radiation member, and an amount of eccentricity of the centers of the plurality of circumferences may increase toward a periphery of the microwave radiation member. Further, a slot pair may be formed by one of the slots and an adjacent one of the slots arranged in a T-shape, and a plurality of the slot pairs may be arranged along the plurality of circumferences.

Additionally, there is provided according to another aspect of the present invention a plasma processing method using a microwave plasma processing apparatus which applies plasma processing to a substrate to be processed, comprising; a process container provided therein with a placement stage on which the substrate to be processed is placed; a microwave generator which generates a microwave and supplies the microwave to the process container; and a microwave radiation member provided between the microwave generator and the process container so as to radiate the microwave to a space of the process container, wherein the microwave radiation member has a plurality of slots arranged along a plurality of circumferences, and the plurality of circumferences are non-Concentric to each other, the method comprising: placing the substrate to be processed on the placement stage so that a processing surface of the substrate faces the microwave radiation member; supplying the microwave to the microwave radiation member so as to introduce the microwave into the process container through the non-concentrically arranged slots; and generating plasma in the process container by the introduced microwave so as to apply a plasma process to the substrate by the generated plasma.

Additionally, there is provided according to another aspect of the present invention a microwave radiation member used for a microwave plasma processing apparatus comprising a process container which applies a plasma process and a microwave generator which generates a microwave and supplies to the process container, wherein the microwave radiation member is attached to the process container and is connected to the microwave generator, and the microwave radiation member has a plurality of slots arranged along a plurality of circumferences non-concentric to each other so as to introduce the microwave into the process container through the plurality of slots.

In the above-mentioned invention, the centers of the plurality of circumferences may be eccentric in different directions to each other with respect to the center of the microwave radiation member. Additionally, the centers of the plurality of circumferences may be eccentric in the same direction to each other with respect to the center of the microwave radiation member, and an amount of eccentricity of the centers of the plurality of circumferences may increase toward a periphery of the microwave radiation member. Further, a slot pair may be formed by one of the slots and an adjacent one of the slots arranged in a T-shape, and a plurality of the slot pairs may be arranged along the plurality of circumferences.

According to the above-mentioned invention, the density of plasma to generate can be uniformized by arranging the plurality of slots of the microwave radiation member along the plurality of non-concentric circumferences. By making the plurality of non-concentric circumferences eccentric in different directions, the electron density, which tends to increase at the central part of the microwave radiation member, can be decreased so as to uniformize the plasma density. Moreover, the plasma density can be uniformized by intentionally generating a variation in the distribution of electron density by making the plurality of non-concentric circumferences eccentric in the same direction and correcting by synthesizing with a variation of the plasma density due to other causes.

Other objects, features and advantages of the present invention will become more apparent from the following detailed description when read in conjunction with the accompanying drawings.

BEST MODE FOR CARRYING OUT THE INVENTION

Figure 1:
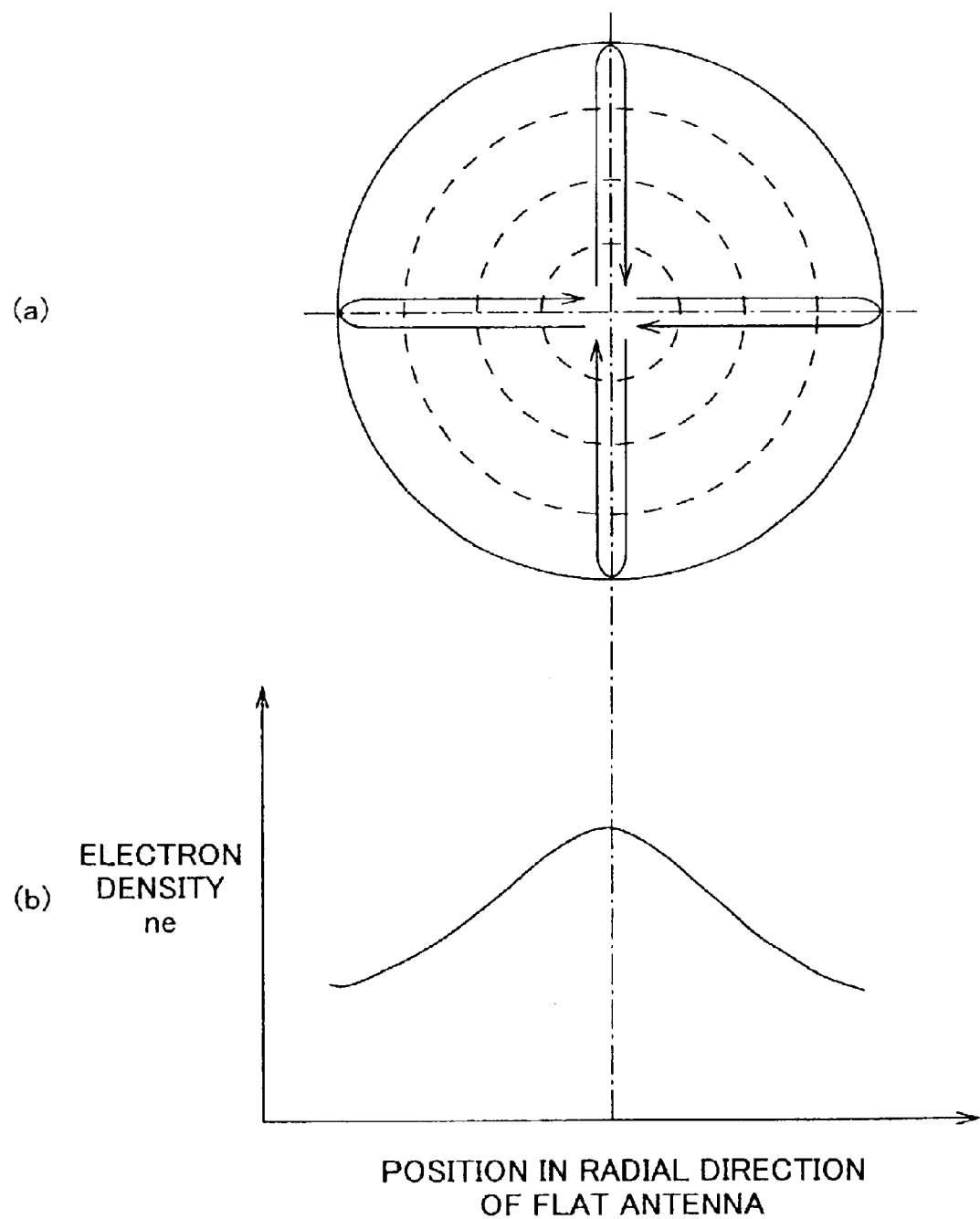
FIG. 1 is an illustration showing propagation of a surface wave in an antenna member having concentrically arranged slots and a distribution of electron density in a plasma space.

A description will be given below, with reference to the drawings, of embodiments according to the present invention. It should be noted that the same parts in the figures are give the same reference numerals.

Figure 2:
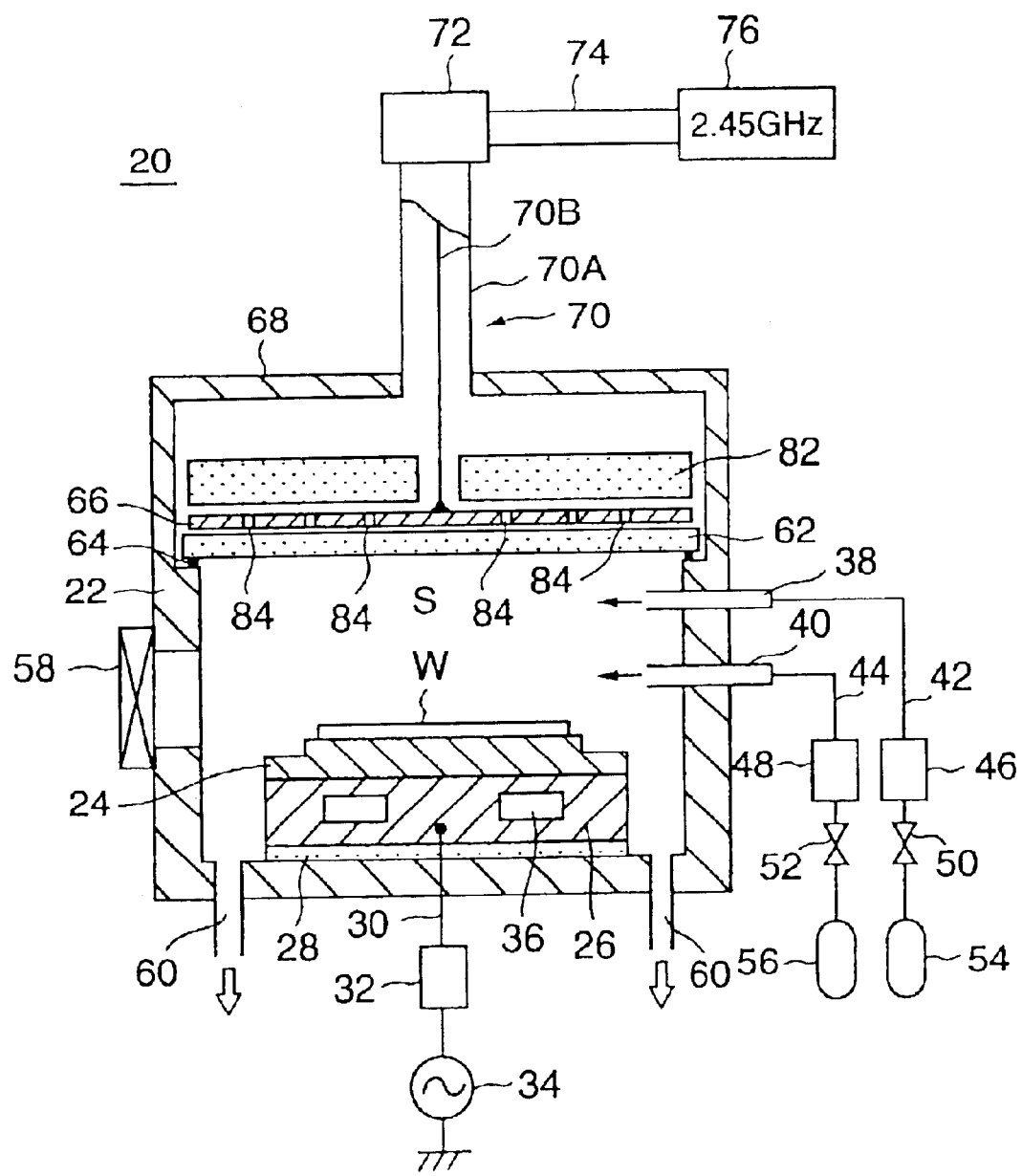
FIG. 2 is a cross-sectional view showing an outline structure of a microwave plasma processing apparatus which is provided with an antenna member according to a first embodiment of the present invention.

FIG. 2 is a cross-sectional view showing an outline structure of a microwave plasma processing apparatus which is provided with an antenna member according to a first embodiment of the present invention. It should be noted that the microwave plasma processing apparatus shown in FIG. 2 is a plasma CVD processing apparatus as an example.

The plasma CVD apparatus 20 shown in FIG. 2 has a process container 22 which is formed in a cylindrical shape in its entirety. The process container 22 is constituted by a conductor such as aluminum, and forms a closed process space S therein.

A placement stage 24 on which a semiconductor wafer W as an object to be processed is placed is accommodated in the process container 22. The placement stage 24 is formed in a generally cylindrical shape with a protruding central part by, for example, an anodized aluminum. The lower part of the placement stage 24 is supported by a support base 26 which is also formed in a cylindrical-shape by aluminum etc. The support base 26 is installed on a bottom of the process container 22 through an insulating material 28.

The upper surface of the placement stage 24 is provided with an electrostatic chuck or a clamp mechanism (not shown) for holding the semiconductor wafer W. The placement stage 24 is connected to a matching box 32 and a high-frequency power source 34 for bias through a power supply line 30. Although the high-frequency power source for bias generates and supplied a high-frequency wave of 13.56 MHz, it is not always necessary to provide.

The support base 26, which supports the placement stage 24, is provided with a cooling jacket 36 through which a cooling water flows for cooling the wafer W during plasma processing. It should be noted that a heater for heating may be incorporated into the placement stage 24 if needed.

Provided on the side wall of the process container are a quartz plasma gas supply nozzle 38 which supplies a gas for plasma such as, for example, argon gas and a quartz process gas nozzle 40 introduces a process gas such as, for example, a deposition gas. The nozzles 38 and 40 are connected to the plasma gas source 54 and a process gas source via mass-flow controllers 46 and 48 and open/close valves 50 and 52, respectively. $SiH_4$, $O_2$, $N_2$ gas etc. are used for a deposition gas as a process gas.

Additionally, a gate valve 58, which opens and closes when carrying in and taking out the wafer W to the inside, is provided on the outer periphery of the sidewall of the process container 22. Moreover, an exhaust port 60 connected to a vacuum pump (not shown) is provided on the bottom of the process container 22 so that the inside of the process container 22 can be evacuated to a predetermined pressure if needed. Then, the ceiling part of the process container 22 is open, and a dielectric plate 62 is airtightly provided thereto via a seal member 64, the dielectric plate 62 being made of a ceramic material such as aluminum nitride AlN or aluminum oxide $Al_2O_3$ or silicon oxide $SiO_2$. The thickness of the dielectric plate 62 is 20 mm, for example, and has permeability to microwaves.

Provided on the upper surface of the dielectric plate 62 is a disc-like flat antenna member (microwave radiation member) 66. Specifically, the flat antenna member 66 is constituted as a bottom plate of a waveguide box 68, which forms a hollow cylindrical container and is integrally formed with the process container 22. The flat antenna member 66 is provided so as to face the placement stage 24 in the process container 22. At the center of an upper part of the waveguide box 68, an outer conductor 70A of a coaxial waveguide 70 is connected, and an inner conductor 70B inside is connected to the central part of the antenna member 66. Then, the coaxial waveguide 70 is connected to a 2.45 GHz microwave generator 76 through a mode converter 72 and a waveguide 74 so as to propagate a microwave to the flat antenna member 66. The frequency of the microwave is not limited to 2.45 GHz, and, for example, 8.35 GHz may be used. As for the waveguide, a waveguide having a circular cross section or a rectangular cross section or a coaxial waveguide can be used. The coaxial waveguide is used in the microwave plasma processing apparatus shown in FIG. 2. Additionally, a wave retardation member 82, which is made of, for example, Al2O3 and has a predetermined permittivity and a predetermined thickness, is provided on the upper surface of the flat antenna member 66 so as to reduce a wavelength of the microwave in the waveguide due to a wavelength reducing effect thereof. It should be noted that the wave retardation member 82 may be provided if needed.

Figure 3:
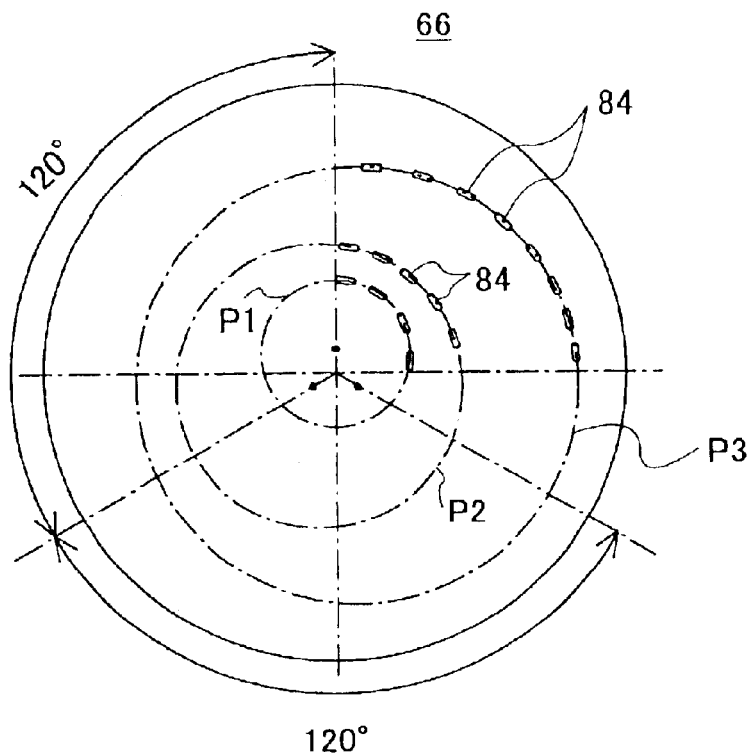
FIG. 3 is a plan view of the antenna member shown in FIG. 2.

Next, a description will be given in detail, with reference to FIG. 3, of the flat antenna member 66 as a microwave radiation member according to the first embodiment of the present invention. FIG. 3 is a plan view of the flat antenna member 66. In a case of corresponding to 8-inch size wafer, the flat antenna member 66 is made of a metal disc having a diameter of 30–40 cm and a thickness of 1 to several millimeters. More specifically, the flat antenna member 66 is made of a metal plate such as a silver plated copper plate or an aluminum plate.

The flat antenna member 66 is provided with a plurality of slots 84, which penetrate in the direction of thickness thereof and has a curved plane configuration. As shown in FIG. 3, each of the slot 84s has an elongated elliptic shape, and is arranged along three different circumferences P1, P2 and P3. It should be noted that although the slots 84 are provided along the entire length of each of the circumferences P1, P2 and P3, FIG. 3 shows only a part of the slots 84 for the sake of simplification. Here, the centers of the circumferences P1, P2 and P3 are shifted from (eccentric to) the center of the outer shape of the flat antenna member 66, and a direction of shift (direction of eccentricity) of each circumference differs to each other.

That is, the direction of shift of the middle circumference P2 from the center of the outer configuration of the flat antenna member 66 is different by 120 degrees from the direction of shift of the inner circumference P1 from the center of the outer configuration of the flat antenna member 66. Additionally, the direction of shift of the outer circumference P3 from the center of the outer configuration of the flat antenna member 66 is different by 120 degrees from the direction of shift of the middle circumference P2 from the center of the outer configuration of the flat antenna member 66. Thus, the centers of the circumferences P1, P2 and P3 are shifted in different directions to each other.

Thus, when the slots are arranged along a plurality of non-concentric circumferences, the surface waves, which propagate in the surface of the dielectric plate 62 and reflected by the outer periphery, return to the central part of the flat antenna member 66, but they are not concentrated into a single point of the center of the flat antenna member 66. That is, the surface wave returns to a range having a certain area in accordance with the amount of shift of the circumferences P1, P2 and P3. Therefore, according to the arrangement of the slots in the flat antenna member 66 according to the present embodiment, uniformity of electron density is improved as compared to the conventional flat antenna member in which unevenness occurs in the electron density in a plasma space due to concentration of surface waves into a single point when the circumference P1, P2 and P3 are concentric circles, and the distribution of plasma density can be uniformized to a certain extent.

Figure 4:
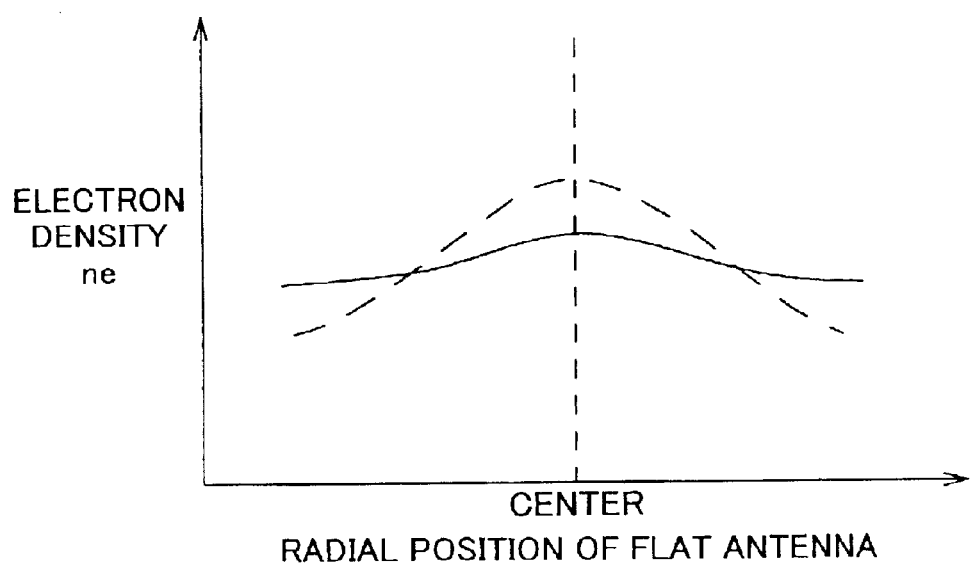
FIG. 4 is a graph showing the distribution of electron density when using the flat antenna member according to the first embodiment of the present invention.

FIG. 4 is a graph showing a distribution ne of electron density in a case where the flat antenna member 66 according to the first embodiment of the present invention is used, and the distribution of electron density shown corresponds to a case where the slots are conventionally arranged along concentric circumferences. As shown in FIG. 4, according to the flat antenna member 66 according to the first embodiment of the present invention which has the slots located in a non-concentric arrangement, the electron density in an area corresponding to the central part of the flat antenna member 66 is reduced and an area corresponding to a peripheral part is increased as compared to the distribution of electron density in the conventional case where the slots are located in the concentric arrangement. Therefore, according to the flat antenna member 66 of the first embodiment of the present invention, the plasma density in a radial direction of the flat antenna member 66 (that is, a radial direction of the wafer W) is uniformized as compared to the conventional case, and, thus, a uniform plasma process can be applied to the wafer W.

Figure 5A:
FIGS. 5A–5F are illustrations showing plane configurations of the slot.
Figure 5B:
Figure 5C:
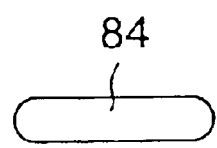
Figure 5D:
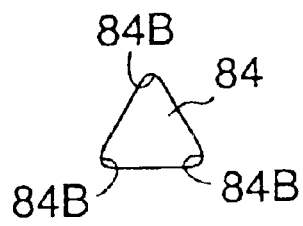
Figure 5E:
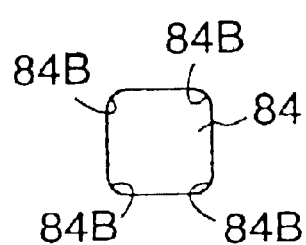
Figure 5F:
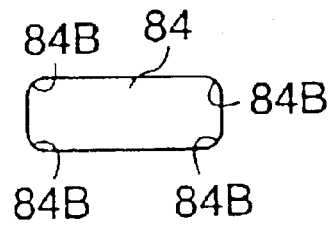

Although the plane configuration of each slot 84 is made as an elongated ellipse in the case shown in FIG. 3, the present invention is not limited to such a configuration, and, for example, a circular shape as shown in FIG. 5A may be used or an elliptic shape having different eccentricity as shown in FIG. 5B may be used. Additionally, a pair of short sides of a rectangle may be formed as arcs as shown in FIG. 5C, or each corner 84B of a triangle, a square or a rectangle may be formed in a curved shape as shown in FIG. 5D, FIG. 5E and FIG. 5F. Moreover, although not illustrated, each corner of a polygon having more than five sides may be formed in a curved shape.

Since the plane configuration of each slot 84 does not contain an angle part which tends to generate an electric-field concentration in the above-mentioned cases, there is an effect in that an abnormal discharge is prevented which permits supply of a large electric power.

Moreover, although the slot 84 shown in FIG. 3 is arranged so as to extend in a tangential direction,of a circumference, it may be arranged with a predetermined angle such as, for example, 45 degrees with respect to the tangential direction. Moreover, pairs of slots arranged in T-shape may be arranged along non-concentric circumferences. In a flat antenna member 66A shown in FIG. 6, slot pairs each of which consists of slots 92A and 92B located in a T-shape are arranged along four pairs of circumferences (indicated by single-dashed chain lines in the figure). It should be noted that, in FIG. 6, the adjacent two circumferences indicated by single-dashed chain lines make a pair, and the circumferences making a pair are concentric to each other. Each slot pair 92 is formed by the slots 92A and slot 92B, which are arranged along the pair of circumferences.

Here, as for the four pairs of circumferences, the direction of shift (direction of eccentricity) differs by 90 degrees to each other. That is, the center of the innermost pair of circumferences is shifted downward from the center O of the outer configuration of the flat antenna member 66A, and the center of the outer pair of the circumferences is shifted leftward in the figure from the center O of the outer configuration of the flat antenna member 66A. Moreover, the center of the outer pair of circumferences is shifted upward from the center O of the outer configuration of the flat antenna member 66A. Furthermore, the center of the outermost pair of circumferences is shifted rightward from the center O of the outer configuration of the flat antenna member 66A. Therefore, similar to the flat antenna member 66 shown in FIG. 3, surface waves reflected by the side surface of the flat antenna member are not concentrated into a single point, and the plasma density is prevented from being increased at the central part.

Here, the longitudinal direction of the slot 92A and the longitudinal direction of the slot 92B are perpendicular to each other, and an end of the slot 92B is close to the center of the slot 92a in the longitudinal direction. Moreover, the longitudinal direction of the slot 92A inclines by about 45 degrees to a line which connects the center section of the slot 92A and the center of the circumference along which the slot 92A is arranged, and, similarly, inclines by about 45 degrees to a line which connects the central section of the slot 92B and the center of the circumference along which the slot 92B is arranged. According to such a T-shaped slot pair, a microwave propagating in a radial direction can be efficiently converted into a circular-deflected electric field, and uniform plasma can be generated efficiently.

Figure 7:
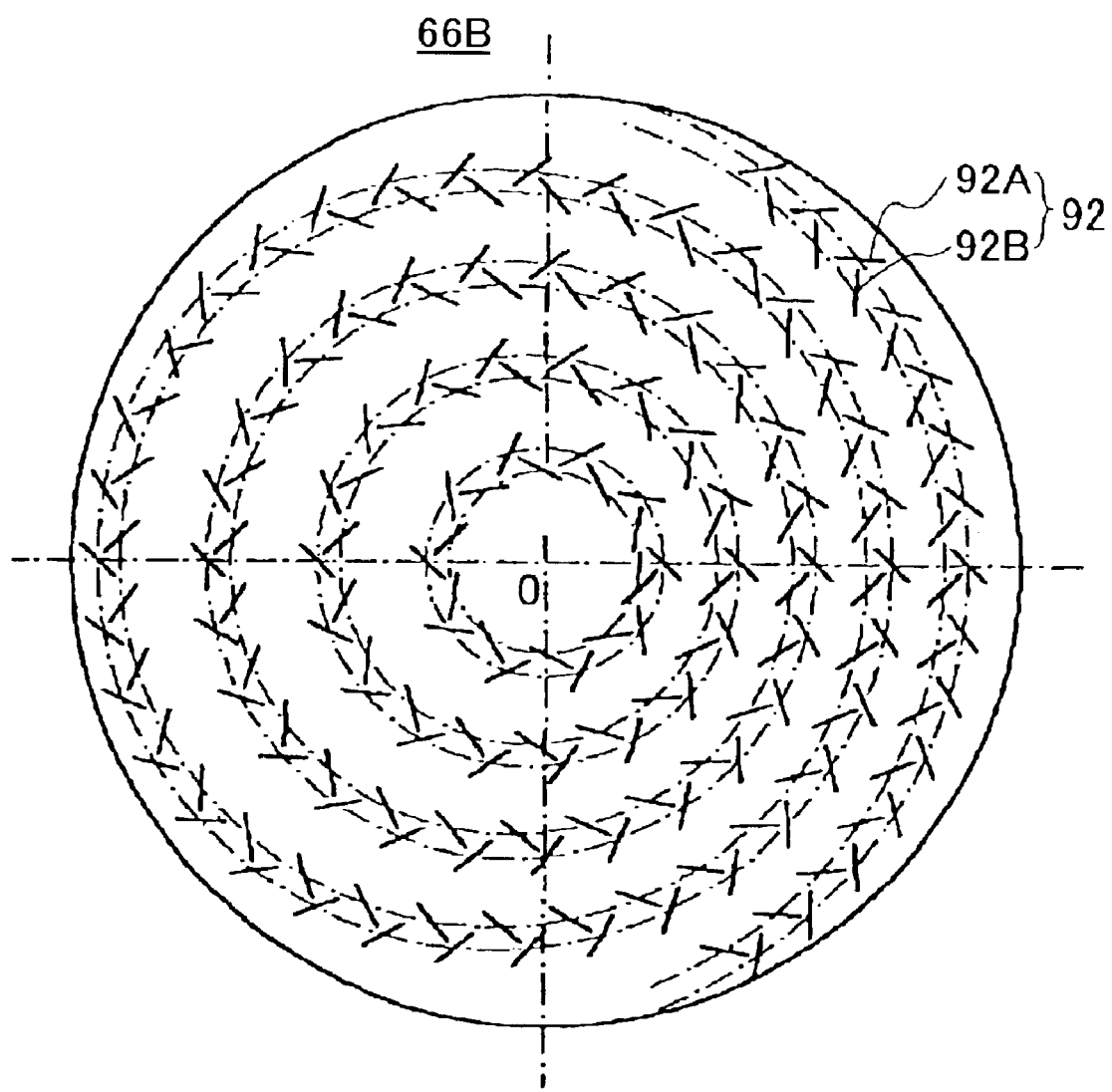
FIG. 7 is a plan view of a flat antenna member according to a second embodiment of the present invention.

Next, a description will be given, with reference to FIG. 7, of a second embodiment of the present invention. FIG. 7 is a plan view of a flat antenna member 66B according to the second embodiment of the present invention.

Figure 8:
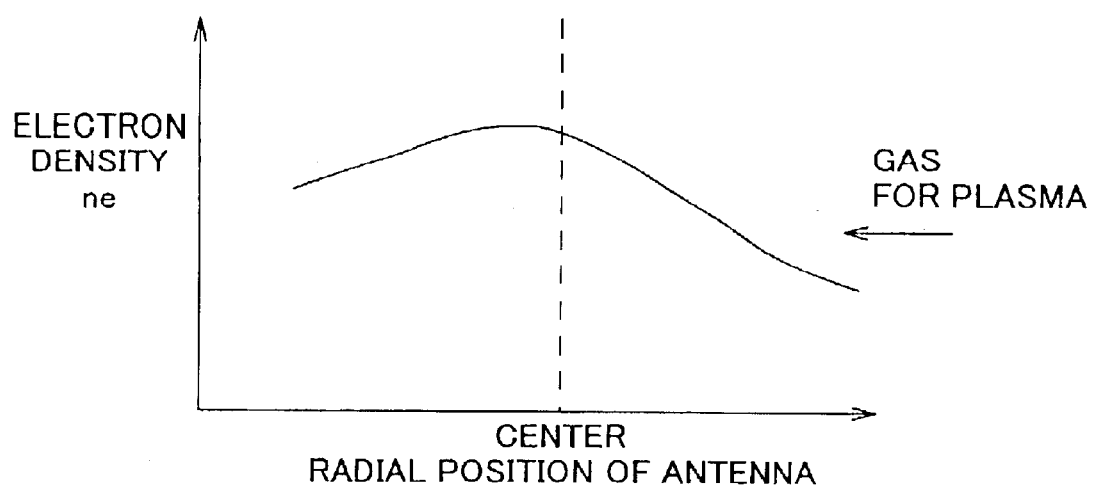
FIG. 8 is a graph showing a distribution of electron density generated by the flat antenna member shown in FIG. 7.

Here, as shown in FIG. 2, when a gas for plasma is supplied from the side to the wafer W in the plasma processing apparatus, a deflection as shown in FIG. 8 is generated in the electron density of the plasma space. That is, the electron density on the upstream side in the direction of supply of the gas for plasma is decreased, and the electron density on the downstream side is increased. Therefore, the plasma density tends to be nonuniform.

The flat antenna member 66B according to the second embodiment of the present invention solves the above-mentioned problem by taking the arrangement of the slots into consideration. That is, a deflection is intentionally given to the distribution of microwave radiation by giving a deflection to the arrangement of the slots so as to correct the deflection in the distribution of plasma density due to a method of supplying a gas for plasma by the deflection of radiation of a microwave by the flat antenna member.

Figure 6:
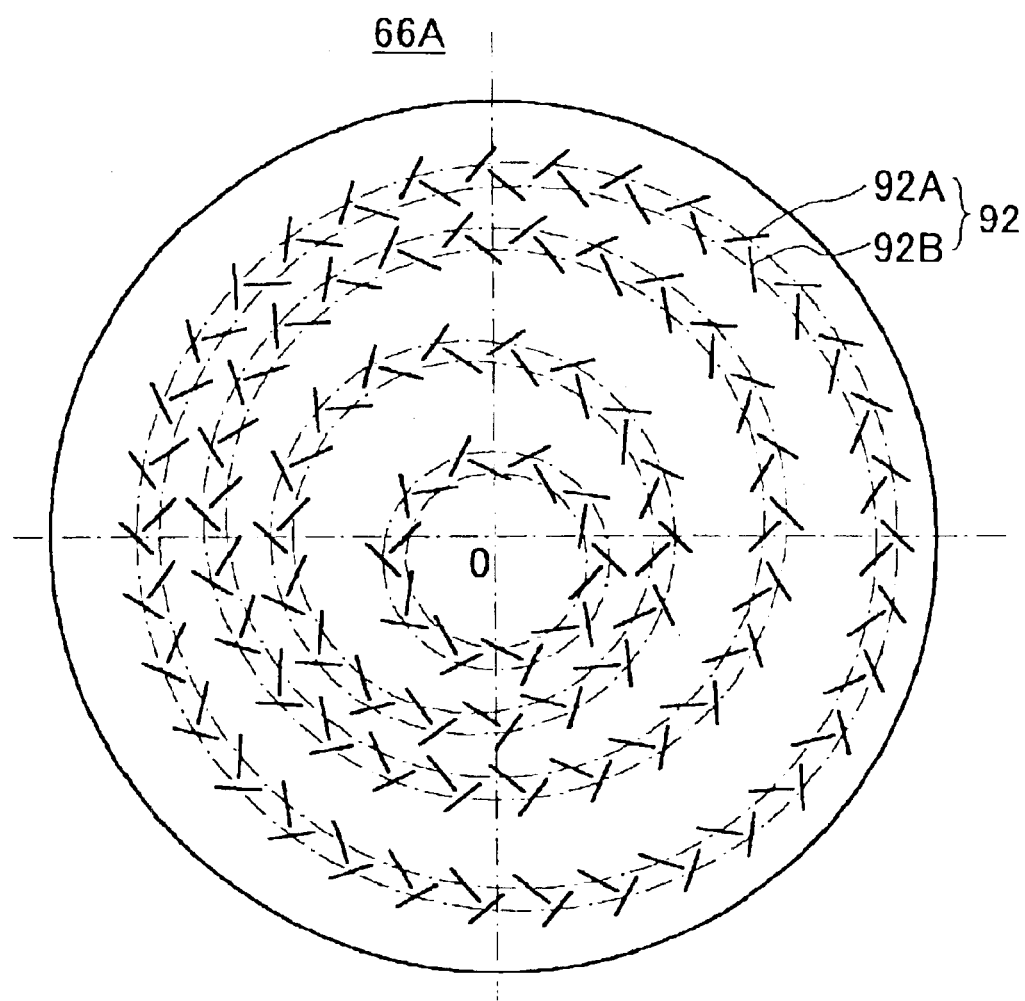
FIG. 6 is a plan view of a flat antenna member using T-shaped slot pairs.

The flat antenna member 66B shown in FIG. 7 has T-shaped slot pairs 92 similar to the flat antenna member 66A shown in FIG. 6, and the center of the pair of circumferences along which the pair of slots are arranged are shifted from the center O of the flat antenna member 66B. However, in the flat antenna member 66B, the centers of all four pairs of circumferences are shifted in the same direction. In FIG. 7, although the center of the innermost pair of circumferences aligns with the center of the flat antenna member 66B, the centers of all outer pairs of circumferences are shifted leftward, and the amount of shift is increased toward outside.

Therefore, in the flat antenna member 66B shown in FIG. 7, the density of the slot pairs 92 is high on the right side section, and is low on the left side section. Thus, the microwave field intensity of the radiated microwave is set large on the right side section (where the slot density is high) of the flat antenna member 66B, and is set small on the left side section (where the slot density is low) of the flat antenna member 66B.

Figure 9:
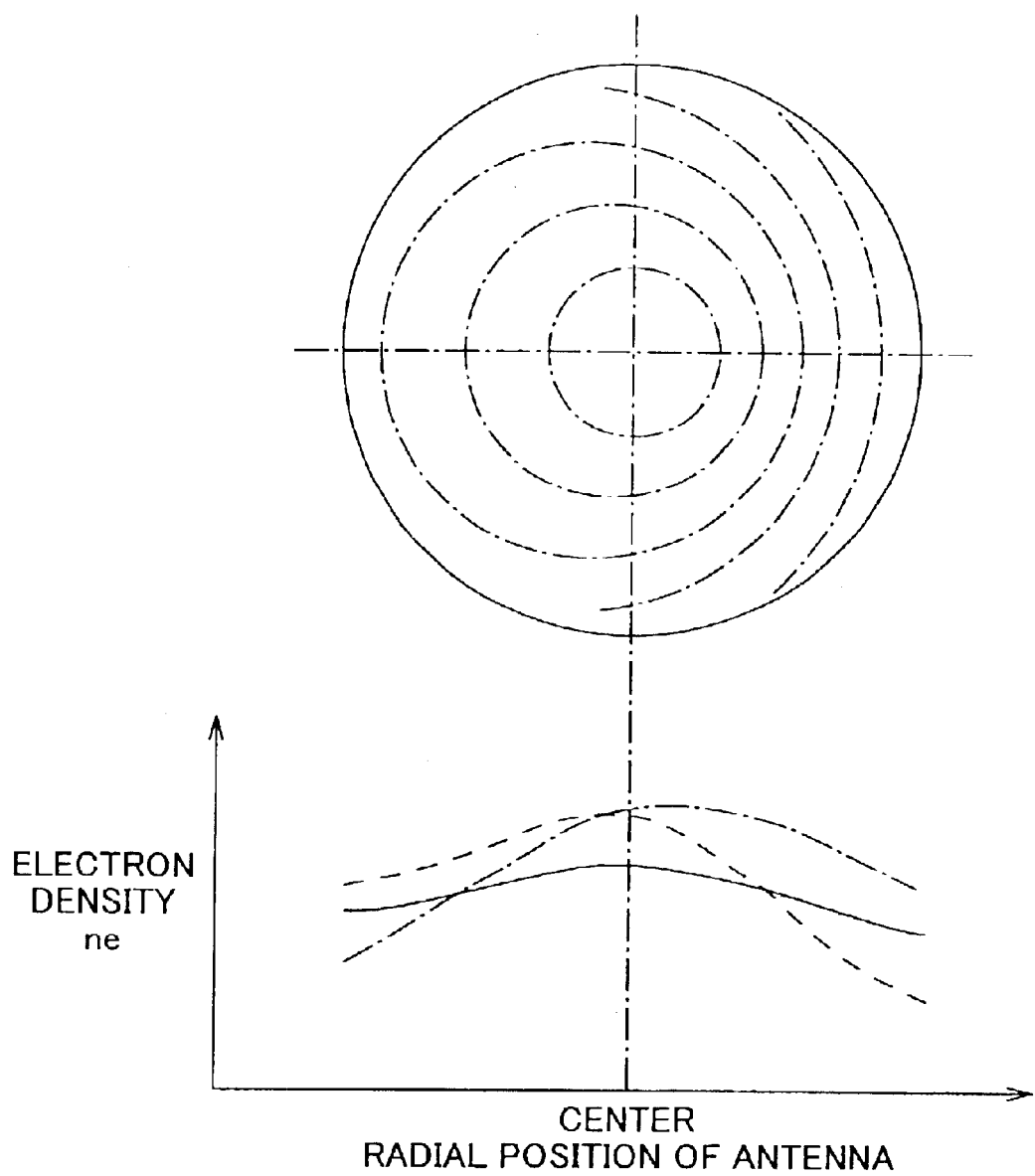
FIG. 9 is a graph for explaining a structure to correct a variation in electron density by the flat antenna member shown in FIG. 7.

Thus, in a case where the antenna member having slots of non-concentric arrangement as shown in FIG. 9, the deflection in the electron density due to the arrangement of the slots of the flat antenna member can be corrected by corresponding a section where the intensity of radiation of a microwave is larger to a section where the electron density is smaller due to a method of supplying a gas for plasma.

As mentioned above, also in the present embodiment, in the flat antenna member of a structure in which the slots are arranged along a plurality of circumferences non-concentric to each other, a deflection in the electron density generated by other causes can be corrected by intentionally generating a deflection of electron density by matching the direction of shift of each circumference, and, thus, uniform plasma can be achieved.

It should be noted that, also in the second embodiment of the present invention, similar to the first embodiment, a single slot may be used instead of the slot pair, and the slot may have various plane configurations as shown in FIGS. 5A–5F.

The present invention is not limited to the above-mentioned specifically disclosed embodiments, and variations and modifications may be made within the scope of the present invention.

What is claimed is:

1. A microwave plasma processing apparatus which applies plasma processing to a substrate to be processed comprising:

a process container provided therein with a placement stage on which the substrate to be processed is placed;

a microwave generator which generates a microwave and supplies said microwave to said process container; and a microwave radiation member provided between the microwave generator and said process container so as to radiate the microwave to a space of said process container, wherein said microwave radiation member has a plurality of slots arranged along a plurality of circumferences, and the plurality of circumferences are non-concentric to each other.

2. A microwave plasma processing which applies plasma processing to a substrate to be processed comprising:

a process container provided therein with a placement stage on which the substrate to be processed is placed;

a microwave generator which generates a microwave and supplies said microwave to said process container; and a microwave radiation member provided between the microwave generator and said process container so as to radiate the microwave to a space of said process container, wherein said microwave radiation member has a plurality of slots arranged alone a plurality of circumferences, and the plurality of circumferences are non-concentric to each other, and wherein the centers of said plurality of circumferences are eccentric in different directions to each other with respect to the center of said microwave radiation member.

3. The microwave plasma processing apparatus as claimed in claim 1, wherein the centers of said plurality of circumferences are eccentric in the same direction to each other with respect to the center of said microwave radiation member, and an amount of eccentricity of the centers of said plurality of circumferences increases toward a periphery of said microwave radiation member.

4. The microwave plasma processing apparatus as claimed in claim 1 or 3, wherein a slot pair is formed by one of said slots and an adjacent one of said slots arranged in a T-shape, and a plurality of the slot pairs are arranged along said plurality of circumferences.

5. A plasma processing method using a microwave plasma processing apparatus which applies plasma processing to a substrate to be processed, comprising: a process container provided therein with a placement stage on which the substrate to be processed is placed; a microwave generator which generates a microwave and supplies said microwave to said process container; and a microwave radiation member provided between the microwave generator and said process container so as to radiate the microwave to a space of said process container, wherein said microwave radiation member has a plurality of slots arranged along a plurality of circumferences, and the plurality of circumferences are non-concentric to each other, the method comprising:

placing said substrate to be processed on said placement stage so that a processing surface of said substrate faces said microwave radiation member;

supplying the microwave to said microwave radiation member so as to introduce the microwave into said process container through said non-concentrically arranged slots; and generating plasma in said process container by the introduced microwave so as to apply a plasma process to said substrate by the generated plasma.

6. A microwave radiation member used for a microwave plasma processing apparatus comprising a process container which applies a plasma process and a microwave generator which generates a microwave and supplies said microwave to said process container, wherein the microwave radiation member is attached to said process container and is connected to said microwave generator, and the microwave radiation member has a plurality of slots arranged along a plurality of circumferences non-concentric to each other so as to introduce the microwave into said process container through the plurality of slots.

7. A microwave radiation member used for a microwave plasma processing apparatus comprising a process container which applies a plasma process and a microwave generator which generates a microwave and supplies said microwave to said process container, wherein the microwave radiation member is attached to said process container and is connected to said microwave generator, and the microwave radiation member has a plurality of slots arranged alone a plurality of circumferences non-concentric to each other so as to introduce the microwave into said process container through the plurality of slots, wherein the centers of said plurality of circumferences are eccentric in different directions to each other with respect to the center of said microwave radiation member.

8. The microwave radiation member as claimed in claim 6, wherein the centers of said plurality of circumferences are eccentric in the same direction to each other with respect to the center of said microwave radiation member, and an amount of eccentricity of the centers of said plurality of circumferences increases toward a periphery of said microwave radiation member.

9. The microwave radiation member as claimed in claim 6 or 8, wherein a slot pair is formed by one of said slots and an adjacent one of said slots arranged in a T-shape, and a plurality of the slot pairs are arranged along said plurality of circumferences.

10. The microwave plasma processing apparatus as claimed in claim 2, wherein a slot pair is formed by one of said slots and an adjacent one of said slots arranged in a T-shape, and a plurality of the slot pairs are arranged along said plurality of circumferences.

11. The microwave radiation member as claimed in claim 7, wherein a slot pair is formed by one of said slots and an adjacent one of said slots arranged in a T-shape, and a plurality of the slot pairs are arranged along said plurality of circumferences.

12. A microwave plasma processing apparatus which applies plasma processing to a substrate to be processed comprising:

a process container provided therein with a placement stage on which the substrate to be processed is placed;

a microwave generator which generates a microwave and supplies said microwave to said process container; and a microwave radiation member provided between the microwave generator and said process container so as to radiate the microwave to a space of said process container, wherein said microwave radiation member has a plurality of slots arranged along a plurality of discrete circumferences, and the plurality of discrete circumferences are non-concentric to each other.

13. The microwave plasma processing apparatus as claimed in claim 12, wherein the centers of said plurality of discrete circumferences are eccentric in different directions to each other with respect to the center of said microwave radiation member.

14. The microwave plasma processing apparatus as claimed in claim 12, wherein the centers of said plurality of discrete circumferences are eccentric in the same direction to each other with respect to the center of said microwave radiation member, and an amount of eccentricity of the centers of said plurality of discrete circumferences increases toward a periphery of said microwave radiation member.

15. The microwave plasma processing apparatus as claimed in any one of claims 12 to 14, wherein a slot pair is formed by one of said slots and an adjacent one of said slots arranged in a T-shape, and a plurality of the slot pairs are arranged along said plurality of discrete circumferences.

16. A plasma processing method using a microwave plasma processing apparatus which applies plasma processing to a substrate to be processed, comprising: a process container provided therein with a placement stage on which the substrate to be processed is placed, a microwave generator which generates a microwave and supplies said microwave to said process container; and a microwave radiation member provided between the microwave generator and said process container so as to radiate the microwave to a space of said process container, wherein said microwave radiation member has a plurality of slots arranged along a plurality of discrete circumferences, and the plurality of discrete circumferences are non-concentric to each other, the method comprising:

placing said substrate to be processed on said placement stage so that a processing surface of said substrate faces said microwave radiation member;

supplying the microwave to said microwave radiation member so as to introduce the microwave into said process container through said non-concentrically arranged slots; and generating plasma in said process container by the introduced microwave so as to apply a plasma process to said substrate by the generated plasma.

17. A microwave radiation member used for a microwave plasma processing apparatus comprising a process container which applies a plasma process and a microwave generator which generates a microwave and supplies said microwave to said process container, wherein the microwave radiation member is attached to said process container and is connected to said microwave generator, and the microwave radiation member has a plurality of slots arranged along a plurality of discrete circumferences non-concentric to each other so as to introduce the microwave into said process container through the plurality of slots.

18. The microwave radiation member as claimed in claim 17, wherein the centers of said plurality of discrete circumferences are eccentric in different directions to each other with respect to the center of said microwave radiation member.

19. The microwave radiation member as claimed in claim 17, wherein the centers of said plurality of discrete circumferences are eccentric in the same direction to each other with respect to the center of said microwave radiation member, and an amount of eccentricity of the centers of said plurality of discrete circumferences increases toward a periphery of said microwave radiation member.

20. The microwave radiation member as claimed in one of claims 17 to 19, wherein a slot pair is formed by one of said slots and an adjacent one of said slots arranged in a T-shape, and a plurality of the slot pairs are arranged along said plurality of discrete circumferences.

* * * * *